(12) United States Patent
Larson, III

(10) Patent No.: US 7,675,390 B2
(45) Date of Patent: *Mar. 9, 2010

(54) ACOUSTIC GALVANIC ISOLATOR INCORPORATING SINGLE DECOUPLED STACKED BULK ACOUSTIC RESONATOR

(75) Inventor: John D Larson, III, Palo Alto, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 718 days.

This patent is subject to a terminal disclaimer.

(21) Appl. No.: 11/253,851

(22) Filed: Oct. 18, 2005

(65) Prior Publication Data
US 2007/0090892 A1   Apr. 26, 2007

(51) Int. Cl.
*H03H 9/54* (2006.01)
*H01L 41/04* (2006.01)
*H01L 41/083* (2006.01)

(52) U.S. Cl. .................... 333/189; 333/187; 310/311; 310/326

(58) Field of Classification Search ........... 333/187, 333/189; 310/311, 320, 324, 326, 327
See application file for complete search history.

(56) References Cited

U.S. PATENT DOCUMENTS

| | | | |
|---|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirer et al. |
| 3,568,108 A | 3/1971 | Poirier et al. |
| 3,582,839 A | 6/1971 | Pim et al. |
| 3,590,287 A | 6/1971 | Berlincourt et al. |
| 3,607,761 A | 9/1971 | Feighner et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |

(Continued)

FOREIGN PATENT DOCUMENTS

DE   10160617   6/2003

(Continued)

OTHER PUBLICATIONS

D. Vasic et al.; "A new MOSFET & IGBT Gate Drive Insulated By A Piezoelectric Transformer"; IEEE 32nd Annual Power Electronics Specialists Conference, 2001; vol. 3, pp. 1479-1484, Jun. 17-21, 2001.*

(Continued)

*Primary Examiner*—Barbara Summons

(57) ABSTRACT

Embodiments of the acoustic galvanic isolator comprise a carrier signal source, a modulator connected to receive an information signal and the carrier signal, a demodulator, and an electrically-isolating acoustic coupler connected between the modulator and the demodulator. The acoustic coupler comprises no more than one decoupled stacked bulk acoustic resonator (DSBAR). An electrically-isolating acoustic coupler based on a single DSBAR is physically small and is inexpensive to fabricate yet is capable of passing information signals having data rates in excess of 100 Mbit/s and has a substantial breakdown voltage between its inputs and its outputs.

20 Claims, 3 Drawing Sheets

U.S. PATENT DOCUMENTS

| | | |
|---|---|---|
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,608,541 A * | 8/1986 | Moriwaki et al. ............. 330/10 |
| 4,625,138 A | 11/1986 | Ballato |
| 4,640,756 A | 2/1987 | Wang et al. |
| 4,719,383 A | 1/1988 | Wang et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,185,589 A | 2/1993 | Krishnaswamy et al. |
| 5,214,392 A * | 5/1993 | Kobayashi et al. ............. 330/10 |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Korbin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa |
| 6,060,818 A | 5/2000 | Ruby et al. |
| 6,087,198 A | 7/2000 | Panasik |
| 6,107,721 A | 8/2000 | Lakin |
| 6,111,341 A | 8/2000 | Hirama |
| 6,111,480 A | 8/2000 | Iyama et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,548,943 B2 | 4/2003 | Kaitila et al. |
| 6,550,664 B2 | 4/2003 | Bradley et al. |
| 6,559,487 B1 | 5/2003 | Kang et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |

| | | | | | | |
|---|---|---|---|---|---|---|
| 6,710,508 | B2 | 3/2004 | Ruby et al. | 7,368,857 B2 | 5/2008 | Tanaka |
| 6,710,681 | B2 | 3/2004 | Figueredo et al. | 7,369,013 B2 | 5/2008 | Fazzio et al. |
| 6,714,102 | B2 | 3/2004 | Ruby et al. | 7,388,318 B2 | 6/2008 | Yamada et al. |
| 6,720,844 | B1 | 4/2004 | Lakin | 7,388,454 B2 | 6/2008 | Ruby et al. |
| 6,720,846 | B2 | 4/2004 | Iwashita et al. | 7,388,455 B2 | 6/2008 | Larson, III |
| 6,724,266 | B2 | 4/2004 | Plazza et al. | 7,408,428 B2 | 8/2008 | Larson, III |
| 6,738,267 | B1 | 5/2004 | Navas et al. | 7,414,349 B2 | 8/2008 | Sasaki |
| 6,774,746 | B2 | 8/2004 | Whatmore et al. | 7,414,495 B2 | 8/2008 | Iwasaki et al. |
| 6,777,263 | B1 | 8/2004 | Gan et al. | 7,425,787 B2 * | 9/2008 | Larson, III .................. 310/311 |
| 6,787,048 | B2 | 9/2004 | Bradley et al. | 7,439,824 B2 | 10/2008 | Aigner |
| 6,788,170 | B1 | 9/2004 | Kaitila et al. | 2002/0000646 A1 | 1/2002 | Gooch et al. |
| 6,803,835 | B2 | 10/2004 | Frank | 2002/0030424 A1 | 3/2002 | Iwata |
| 6,812,619 | B1 | 11/2004 | Kaitila et al. | 2002/0063497 A1 | 5/2002 | Panasik |
| 6,828,713 | B2 | 12/2004 | Bradley et al. | 2002/0121944 A1 | 9/2002 | Larson, III et al. |
| 6,842,088 | B2 | 1/2005 | Yamada et al. | 2002/0121945 A1 | 9/2002 | Ruby et al. |
| 6,842,089 | B2 | 1/2005 | Lee | 2002/0140520 A1 | 10/2002 | Hikita et al. |
| 6,873,065 | B2 | 3/2005 | Haigh et al. | 2002/0152803 A1 | 10/2002 | Larson, III et al. |
| 6,873,529 | B2 | 3/2005 | Ikuta | 2002/0190814 A1 | 12/2002 | Yamada et al. |
| 6,874,211 | B2 | 4/2005 | Bradley et al. | 2003/0001251 A1 | 1/2003 | Cheever et al. |
| 6,874,212 | B2 | 4/2005 | Larson, III | 2003/0006502 A1 | 1/2003 | Karpman |
| 6,888,424 | B2 | 5/2005 | Takeuchi et al. | 2003/0011285 A1 | 1/2003 | Ossmann |
| 6,900,705 | B2 | 5/2005 | Nakamura et al. | 2003/0051550 A1 | 3/2003 | Nguyen et al. |
| 6,903,452 | B2 | 6/2005 | Ma et al. | 2003/0087469 A1 | 5/2003 | Ma |
| 6,906,451 | B2 | 6/2005 | Yamada et al. | 2003/0102776 A1 | 6/2003 | Takeda et al. |
| 6,911,708 | B2 | 6/2005 | Park | 2003/0111439 A1 | 6/2003 | Fetter et al. |
| 6,917,261 | B2 | 7/2005 | Unterberger | 2003/0128081 A1 | 7/2003 | Ella et al. |
| 6,924,583 | B2 | 8/2005 | Lin et al. | 2003/0132493 A1 | 7/2003 | Kang et al. |
| 6,924,717 | B2 | 8/2005 | Ginsburg et al. | 2003/0141946 A1 | 7/2003 | Ruby et al. |
| 6,927,651 | B2 | 8/2005 | Larson, III et al. | 2003/0179053 A1 | 9/2003 | Aigner et al. |
| 6,936,928 | B2 | 8/2005 | Hedler et al. | 2004/0016995 A1 | 1/2004 | Kuo et al. |
| 6,936,954 | B2 | 8/2005 | Peczalski | 2004/0056735 A1 | 3/2004 | Nomura et al. |
| 6,943,648 | B2 | 9/2005 | Maiz et al. | 2004/0092234 A1 | 5/2004 | Pohjonen |
| 6,946,928 | B2 | 9/2005 | Larson et al. | 2004/0124952 A1 | 7/2004 | Tikka |
| 6,954,121 | B2 | 10/2005 | Bradley et al. | 2004/0150293 A1 | 8/2004 | Unterberger |
| 6,963,257 | B2 | 11/2005 | Ella et al. | 2004/0150296 A1 | 8/2004 | Park et al. |
| 6,970,365 | B2 | 11/2005 | Turchi | 2004/0195937 A1 | 10/2004 | Matsubara et al. |
| 6,975,183 | B2 | 12/2005 | Aigner et al. | 2004/0212458 A1 | 10/2004 | Lee |
| 6,977,563 | B2 | 12/2005 | Komuro et al. | 2004/0257171 A1 | 12/2004 | Park et al. |
| 6,985,052 | B2 | 1/2006 | Tikka | 2004/0257172 A1 | 12/2004 | Schmidhammer et al. |
| 6,987,433 | B2 | 1/2006 | Larson et al. | 2004/0263287 A1 | 12/2004 | Ginsburg et al. |
| 6,989,723 | B2 | 1/2006 | Komuro et al. | 2005/0012570 A1 | 1/2005 | Korden et al. |
| 6,998,940 | B2 | 2/2006 | Metzger | 2005/0023931 A1 | 2/2005 | Bouche et al. |
| 7,002,437 | B2 | 2/2006 | Takeuchi et al. | 2005/0030126 A1 | 2/2005 | Inoue et al. |
| 7,019,604 | B2 | 3/2006 | Gotoh et al. | 2005/0036604 A1 | 2/2005 | Scott et al. |
| 7,019,605 | B2 | 3/2006 | Larson et al. | 2005/0057117 A1 | 3/2005 | Nakatsuka et al. |
| 7,026,876 | B1 | 4/2006 | Esfandiari et al. | 2005/0057324 A1 | 3/2005 | Onishi et al. |
| 7,053,456 | B2 | 5/2006 | Matsuo | 2005/0068124 A1 | 3/2005 | Stoemmer |
| 7,057,476 | B2 | 6/2006 | Hwu | 2005/0093396 A1 | 5/2005 | Larson et al. |
| 7,057,478 | B2 | 6/2006 | Korden et al. | 2005/0093653 A1 | 5/2005 | Larson, III |
| 7,064,606 | B2 | 6/2006 | Louis | 2005/0093654 A1 | 5/2005 | Larson et al. |
| 7,084,553 | B2 | 8/2006 | Ludwiczak | 2005/0093655 A1 | 5/2005 | Larson et al. |
| 7,091,649 | B2 | 8/2006 | Larson | 2005/0093657 A1 | 5/2005 | Larson et al. |
| 7,098,758 | B2 | 8/2006 | Wang et al. | 2005/0093658 A1 | 5/2005 | Larson, III et al. |
| 7,102,460 | B2 | 9/2006 | Schmidhammer et al. | 2005/0093659 A1 | 5/2005 | Larson et al. |
| 7,128,941 | B2 | 10/2006 | Lee | 2005/0104690 A1 | 5/2005 | Larson |
| 7,138,889 | B2 | 11/2006 | Lakin | 2005/0110598 A1 | 5/2005 | Larson, III |
| 7,161,448 | B2 | 1/2007 | Feng et al. | 2005/0128030 A1 | 6/2005 | Larson et al. |
| 7,170,215 | B2 | 1/2007 | Namba et al. | 2005/0140466 A1 | 6/2005 | Larson, III et al. |
| 7,173,504 | B2 | 2/2007 | Larson | 2005/0167795 A1 | 8/2005 | Higashi |
| 7,187,254 | B2 | 3/2007 | Su et al. | 2005/0193507 A1 | 9/2005 | Ludwiczak |
| 7,209,374 | B2 | 4/2007 | Noro | 2005/0206271 A1 | 9/2005 | Higuchi et al. |
| 7,212,083 | B2 | 5/2007 | Inoue et a | 2005/0218488 A1 | 10/2005 | Matsuo |
| 7,212,085 | B2 | 5/2007 | Wu | 2006/0081048 A1 | 4/2006 | Mikado et al. |
| 7,230,509 | B2 | 6/2007 | Stoemmer | 2006/0103492 A1 | 5/2006 | Feng et al. |
| 7,230,511 | B2 | 6/2007 | Onishi et al. | 2006/0125489 A1 | 6/2006 | Feucht et al. |
| 7,259,498 | B2 | 8/2007 | Nakatsuka et al. | 2006/0132262 A1 | 6/2006 | Fazzlo et al. |
| 7,275,292 | B2 | 10/2007 | Ruby et al. | 2006/0164183 A1 | 7/2006 | Tikka |
| 7,276,994 | B2 | 10/2007 | Takeuchi et al. | 2006/0185139 A1 | 8/2006 | Larson, III et al. |
| 7,280,007 | B2 | 10/2007 | Feng et al. | 2006/0197411 A1 | 9/2006 | Hoen et al. |
| 7,281,304 | B2 | 10/2007 | Kim et al. | 2006/0238070 A1 * | 10/2006 | Costa et al. .................. 310/318 |
| 7,301,258 | B2 | 11/2007 | Tanaka | 2006/0284707 A1 | 12/2006 | Larson et al. |
| 7,310,861 | B2 | 12/2007 | Aigner et al. | 2006/0290446 A1 | 12/2006 | Aigner et al. |
| 7,367,095 | B2 | 5/2008 | Larson, III et al. | 2007/0080759 A1 | 4/2007 | Jamneala et al. |

| | | | |
|---|---|---|---|
| 2007/0084964 | A1 | 4/2007 | Sternberger |
| 2007/0085447 | A1 | 4/2007 | Larson |
| 2007/0170815 | A1 | 7/2007 | Unkrich |
| 2007/0171002 | A1 | 7/2007 | Unkrich |
| 2007/0205850 | A1 | 9/2007 | Jamneala et al. |
| 2007/0279153 | A1 | 12/2007 | Ruby |
| 2008/0055020 | A1 | 3/2008 | Handtmann |

FOREIGN PATENT DOCUMENTS

| | | | |
|---|---|---|---|
| EP | 231892 | | 8/1987 |
| EP | 0 637 875 | * | 2/1995 |
| EP | 689254 | | 12/1995 |
| EP | 0865157 | | 9/1998 |
| EP | 0880227 | | 11/1998 |
| EP | 0973256 | | 1/2000 |
| EP | 1047189 | | 10/2000 |
| EP | 1100196 | | 11/2000 |
| EP | 1096259 | | 5/2001 |
| EP | 1258990 | | 11/2002 |
| EP | 1180494 | | 3/2003 |
| EP | 1542362 | | 6/2003 |
| EP | 1258989 | | 1/2004 |
| EP | 1528674 | | 6/2004 |
| EP | 1528675 | | 6/2004 |
| EP | 1528677 | | 7/2004 |
| EP | 1249932 | | 3/2005 |
| EP | 1517443 | | 3/2005 |
| EP | 1517444 | | 3/2005 |
| EP | 1557945 | | 7/2005 |
| EP | 1575165 | | 9/2005 |
| GB | 1 207 974 | | 11/1967 |
| GB | 2013343 | * | 8/1979 |
| GB | 2411239 | | 8/2005 |
| GB | 2418791 | | 4/2006 |
| GB | 2427773 | | 1/2007 |
| JP | 61054686 | | 3/1986 |
| JP | 06005944 | | 1/1994 |
| JP | 2002/217676 | | 8/2002 |
| JP | 2003/124779 | | 4/2003 |
| WO | WO-98/16957 | | 4/1998 |
| WO | WO 98/16957 | | 4/1998 |
| WO | WO-01/06647 | | 1/2001 |
| WO | WO-01/99276 | | 12/2001 |
| WO | WO-02/103900 | | 12/2002 |
| WO | WO-03/030358 | | 4/2003 |
| WO | WO-03/043188 | | 5/2003 |
| WO | WO 03/050950 | | 6/2003 |
| WO | WO-03/058809 | | 7/2003 |
| WO | WO-2004/034579 | | 4/2004 |
| WO | WO-2004/051744 | | 6/2004 |
| WO | WO 2004/102688 | * | 11/2004 |
| WO | WO-2005/043752 | | 5/2005 |
| WO | WO-2005/043753 | | 5/2005 |
| WO | WO-2005/043756 | | 5/2005 |
| WO | WO-2006/018788 | | 2/2006 |

OTHER PUBLICATIONS

D. Vasic et al.; "A New Method to Design Piezoelectric Transformer Used in MOSFET & IGBT Gate Drive Circuits"; IEEE 34th Annual Power Electronics Specialists Conference, 2003; vol. 1, pp. 307-312, Jun. 15-19, 2003.*
U.S. Appl. No. 10/971,169, filed Oct. 22, 2004, Larson III, John D., et al.
Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.
Reinhardt, Alexandre et al., "Design of Coupled Resonator Filters Using Admittance and Scattering Matrices", *2003 IEEE Ultrasonics Symposium*, (May 3, 2003),1428-1431.
"Examination report corresponding to application No.", GB0605770.7, (Aug. 25, 2006).
"Examination Report corresponding to application No.", GB0605775.6, (Aug. 30, 2006).
Coombs, Clyde F., et al., "Electronic Instrument Handbook", *Second Edition*, McGraw-Hill, Inc., (1995),pp. 5.1 to 5.29.
"GB Search Report for", Application No. GB0522393.8, (Jan. 9, 2006),4 pages.
"GB Search Report for Application No.", GB0525884.3, (Feb. 2, 2006),4 pgs.
Auld, B. A., "Acoustic Resonators", *Acoustic Fields and Waves in Solids*, Second Edition, vol. II, (1990),250-259.
"British Search Report Application No.", 0605222.9, (Jul. 11, 2006).
Tiersten, H. F., et al., "An Analysis of Thiskness—Extensional Trapped Energy Resonant Device Structures with Rectangular Electrodes in the Piezoelectric Thin Film on Silicon Configuration", *J. Appl. Phys. 54* (10), (Oct. 1983),5893-5910.
"Search Report from corresponding application", No. GB0605225.2, (Jun. 26, 2006).
"Search Report for Great Britain Patent Application", No. 0617742.2, (Mar. 29, 2007).
"Search Report for Great Britain Patent Application", No. 0617742.2, (Dec. 13, 2006).
"Search Report in the Great Britian Patent Application", No. 0619698.4, (Nov. 30, 2006).
Ruby, R. et al., "The Effect of Perimeter Geometry on FBAR Resonator Electrical Performance", *Microwave Symposium Digest, 2005 IEEE MTT-S International*, (Jun. 12, 2005),217-221.
Schuessler, Hans H., "Ceramic Filters and Resonators", *Reprinted from IEEE Trans. Sonics Ultrason.*, vol. SU-21, (Oct. 1974),257-268.
Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.
Choi, Sungjin et al., "Design of Half-Bridge Piezo-Transformer Converters in the AC Adapter Applications", *IEEE 2005*, 244-248.
Li, Yunxiu et al., "AC-DC Converter with Worldwide Range Input Voltage by Series and Parallel Piezoelectric Transformer Connection", *35th Annual IEEE Power Electronics Specialists Conference*, (2004).
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).
Navas, J. et al., "Miniaturised Battery Charger using Piezoelectric Transformers", *IEEE*, (2001),492-496.
Jiang, Yimin et al., "A Novel Single-Phase Power Factor Correction Scheme", *IEEE*, (1993),287-292.
Lakin, K.M. "Coupled Resonator Filters", *2002 IEEE Ultrasonics Symposium*, (Mar. 2, 2002),901-908.
Lakin, K.M. et al., "High Performance Stacked Crystal Filters for GPS and Wide Bandwidth Applications", *2001 IEEE Ultrasonics Symposium*, (Jan. 1, 2001),833-838.
Krishnaswamy, S.V. et al., "Film Bulk Acoustic Wave Resonator Technology", (May 29, 1990),529-536.
Lobl, H.P. et al., "Piezoelectric Materials For BAW Resonators And Filters", *2001 IEEE Ultrasonics Symposium*, (Jan. 1, 2001),807-811.
Lakin, K.M. "Bulk Acoustic Wave Coupled Resonator Filters", *2002 IEEE International Frequency Control Symposium and PDA Exhibition*, (Jan. 2, 2002),8-14.
Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.
Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.
Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.
"Search Report from corresponding application No.", GB 0605779.8, (Aug. 23, 2006).

"Examination Report from UK for application", GB 0605971.1, (Aug. 24, 2006).

Search report from corresponding application No. GB0620152.9 dated Nov. 15, 2006.

Search report from corresponding application No. GB0620655.1 dated Nov. 17, 2006.

Search report from corresponding application No. GB0620653.6 dated Nov. 17, 2006.

Search report from corresponding application No. GB0620657.7 dated Nov. 23, 2006.

Examination report from corresponding application No. GB0605779.8 dated Aug. 23, 2006.

U.S. Appl. No. 10/971,169, filed Oct. 22, 2004, John D. Larson, III et al.

Martin et al., "Development of Low-Dielectric Constant Polymer for Fabrication of Integrated Circuit Interconnect", 12 Advanced Materials, 1769 (2000).

U.S. Appl. No. 11/253,464, filed Oct. 18, 2005, John D. Larson, III.

U.S. Appl. No. 11/253,508, filed Oct. 18, 2005, John D. Larson, III.

U.S. Appl. No. 11/253,463, filed Oct. 18, 2005, John D. Larson, III et al.

U.S. Appl. No. 11/253,444, filed Oct. 18, 2005, John D. Larson, III et al.

U.S. Appl. No. 11/252,845, filed Oct. 18, 2005, Ken Nishimura et al.

Aoyama, Takayuki et al., "Diffusion of Boron, Phosphorous, Arsenic and Antimony in Thermally Grown SiliconDioxide", *Journal of The Electrochemical Society*, vol. 146, No. 5 1999, 1879-1883.

Bauer, L. O. et al., "Properties of Silicon Implanted with Boron Ions through Thermal Silicon Dioxide", *Solid State Electronics,* vol. 16, No. 3 Mar. 1973, 289-300.

Hara, K. , "Surface Treatment of Quartz Oscillator Plate by Ion Implantation", *Oyo Buturi*, vol. 47, No. 2 Feb. 1978, 145-146.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M. , "Thin Film BAW Filters for Wide Bandwidth and High Performance Applications", *IEEE Microwave Symposium Digest*; Vol. 2 Jun. 6-11, 2004 , 923-926.

Lakin, K. M. , "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004 , 407-410.

Larson III, John D. et al., "Measurement of Effective Kt2,Q,Rp,Rs vs. Temperature for Mo/AlN FBAR Resonators", *IEEE Ultrasonics Symposium* 2002, 939-943.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Parker, T. E. et al., "Temperature-Compensated Surface Acoustic-Wave Devices with SiO2 Film Overlays", *J. Appl. Physics*, vol. 50 1360-1369, Mar. 1979.

Ruby, R. C. , "MicroMachined Thin Film Bulk Acoustic Resonators", *IEEE International Frequency Control Symosium* 1994, 135-138.

Sanchez, A.M. et al., "Mixed analytical and numerical design method for piezoelectric transformers", *IEEE,PESX* Jun. 2003, 841-846.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Topich, J. A. et al., "Effects of Ion Implanted Flourine in Silicon Dioxide", *Nuclear Instr. and Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diaego, CA 1082 1982 , 240-245.

* cited by examiner ated with an embodiment of the invention.

ACOUSTIC GALVANIC ISOLATOR INCORPORATING SINGLE DECOUPLED STACKED BULK ACOUSTIC RESONATOR

RELATED APPLICATIONS

This disclosure is related to the following simultaneously-filed disclosures: Acoustic Galvanic Isolator Incorporating Single Insulated Decoupled Stacked Bulk Acoustic Resonator With Acoustically-Resonant Electrical Insulator of John D. Larson III (U.S. patent application Ser. No. 11/253,508); Acoustic Galvanic Isolator Incorporating Film Acoustically-Coupled Transformer of John D. Larson III et al. (U.S. patent application Ser. No. 11/253,463); Acoustic Galvanic Isolator Incorporating Series-Connected Decoupled Stacked Bulk Acoustic Resonators of John D. Larson III et al. (U.S. patent application Ser. No. 11/253,444), and Acoustic Galvanic Isolator of John D. Larson III et al. (U.S. patent application Ser. No. 11/253,464), all of which are incorporated by reference.

Background

A galvanic isolator allows an information signal to pass from its input to its output but has no electrical conduction path between its input and its output. The lack of an electrical conduction path allows the galvanic isolator to prevent unwanted voltages from passing between its input and its output. Strictly speaking, a galvanic isolator blocks only DC voltage, but a typical galvanic isolator additionally blocks a.c. voltage, such as voltages at power line and audio frequencies. An example of a galvanic isolator is a data coupler that passes a high data rate digital information signal but blocks DC voltages and additionally blocks low-frequency a.c. voltages.

One example of a data coupler is an opto-isolator such as the opto-isolators sold by Agilent Technologies, Inc. In an opto-isolator, an electrical information signal is converted to a light signal by a light-emitting diode (LED). The light signal passes through an electrically non-conducting light-transmitting medium, typically an air gap or an optical waveguide, and is received by a photodetector. The photodetector converts the light signal back to an electrical signal. Galvanic isolation is provided because the light signal can pass through the electrically non-conducting light-transmitting medium without the need of metallic conductors.

Other data couplers include a transformer composed of a first coil magnetically coupled to a second coil. Passing the electrical information signal through the first coil converts the electrical information signal to magnetic flux. The magnetic flux passes through air or an electrically non-conducting permeable magnetic material to the second coil. The second coil converts the magnetic flux back to an electrical signal. The transformer allows the high data rate information signal to pass but blocks transmission of DC voltages and low-frequency a.c. voltages. The resistance of the conveyor of the magnetic flux is sufficient to prevent DC voltages and low-frequency a.c. voltages from passing from input to output. Blocking capacitors are sometimes used to provide similar isolation.

Inexpensive opto-isolators are typically limited to data rates of about 10 Mb/s by device capacitance, and from power limitations of the optical devices. The transformer approach requires that the coils have a large inductance yet be capable of transmitting the high data rate information signal. Such conflicting requirements are often difficult to reconcile. Using capacitors does not provide an absolute break in the conduction path because the information signal is transmitted electrically throughout. More successful solutions convert the electrical information signal to another form of signal, e.g., light or a magnetic flux, and then convert the other form of signal back to an electrical signal. This allows the electrical path between input and output to be eliminated.

Many data transmission systems operate at speeds of 100 Mb/s. What is needed is a compact, inexpensive galvanic isolator capable of operating at speeds of 100 Mb/s and above.

SUMMARY OF THE INVENTION

In a first aspect, the invention provides an acoustic galvanic isolator. Embodiments of the acoustic galvanic isolator comprise a carrier signal source, a modulator connected to receive an information signal and the carrier signal, a demodulator, and an electrically-isolating acoustic coupler connected between the modulator and the demodulator. The acoustic coupler comprises no more than one decoupled stacked bulk acoustic resonator (DSBAR).

In a second aspect, the invention provides a method for galvanically isolating an information signal. Embodiments of the method comprise providing an electrically-isolating acoustic coupler comprising no more than one decoupled stacked bulk acoustic resonator (DSBAR); providing a carrier signal; modulating the carrier signal with the information signal to form a modulated electrical signal; acoustically coupling the modulated electrical signal through the electrically-isolating acoustic coupler; and recovering the information signal from the modulated electrical signal acoustically coupled through the electrically-isolating acoustic coupler.

An electrically-isolating acoustic coupler based on a single DSBAR is physically small and is inexpensive to fabricate yet is capable of acoustically coupling information signals having data rates in excess of 100 Mbit/s and has a substantial breakdown voltage between its inputs and its outputs.

DETAILED DESCRIPTION

Figure 1:
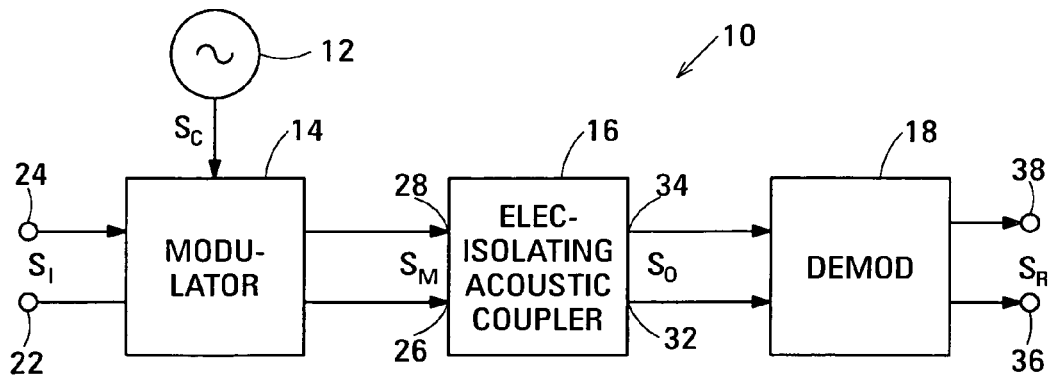
FIG. 1 is a block diagram showing an acoustic galvanic isolator in accordance with an embodiment of the invention.

FIG. 1 is a block diagram showing an acoustic galvanic isolator 10 in accordance with an embodiment of the invention. Acoustic galvanic isolator 10 transmits an electrical information signal $S_I$ between its input terminals and its output terminals yet provides electrical isolation between its input terminals and its output terminals. Acoustic galvanic isolator 10 not only provides electrical isolation at DC but additionally provides a.c. electrical isolation. Electrical information signal $S_I$ is typically a high data rate digital data signal, but may alternatively be an analog signal. In one application, electrical information signal $S_I$ is a 100 Mbit/sec Ethernet signal.

In the example shown, acoustic galvanic isolator 10 is composed of a local oscillator 12, a modulator 14, an electrically-isolating acoustic coupler 16 and a demodulator 18. In the example shown, local oscillator 12 is the source of an electrical carrier signal $S_C$. Modulator 14 has inputs connected to receive electrical information signal $S_I$ from the input terminals 22, 24 of acoustic galvanic isolator 10 and to receive carrier signal $S_C$ from local oscillator 12. Modulator 14 has outputs connected to inputs 26, 28 of electrically-isolating acoustic coupler 16.

Outputs 32, 34 of electrically-isolating acoustic coupler 16 are connected to the inputs of demodulator 18. The outputs of demodulator 18 are connected to output terminals 36, 38 of acoustic galvanic isolator 10.

Electrically-isolating acoustic coupler 16 has a band-pass frequency response that will be described in more detail below with reference to FIG. 3. Local oscillator 12 generates carrier signal $S_C$ at a frequency nominally at the center of the pass band of electrically-isolating acoustic coupler 16. In one exemplary embodiment of acoustic galvanic isolator 10, the pass band of electrically-isolating acoustic coupler 16 is centered at a frequency of 1.9 GHz, and local oscillator 12 generates carrier signal $S_C$ at a frequency of 1.9 GHz. Local oscillator 12 feeds carrier signal $S_C$ to the carrier signal input of modulator 14.

Modulator 14 receives electrical information signal $S_I$ from input terminals 22, 24 and modulates carrier signal $S_C$ with electrical information signal $S_I$ to generate modulated electrical signal $S_M$. Typically, modulated electrical signal $S_M$ is carrier signal $S_C$ amplitude modulated in accordance with electrical information signal $S_I$. Any suitable modulation scheme may be used. In an example in which carrier signal $S_C$ is amplitude modulated by electrical information signal $S_I$ and electrical information signal $S_I$ is a digital signal having low and high signal levels respectively representing 0s and 1s, modulated electrical signal $S_M$ has small and large amplitudes respectively representing the 0s and 1s of the electrical information signal.

As will be described in more detail below with reference to FIGS. 2 and 4A-4C, electrically-isolating acoustic coupler 16 acoustically couples modulated electrical signal $S_M$ from its inputs 26, 28 to its outputs 32, 34 to provide an electrical output signal $S_O$ to the inputs of demodulator 18. Electrical output signal $S_O$ is similar to modulated electrical signal $S_M$, i.e., it is a modulated electrical signal having the same frequency as carrier signal $S_C$, the same modulation scheme as modulated electrical signal $S_M$ and the same information content as electrical information signal $S_I$. Demodulator 18 demodulates electrical output signal $S_O$ to recover electrical information signal $S_I$ as recovered electrical information signal $S_R$. Recovered electrical information signal $S_R$ is output from demodulator 18 to output terminals 36, 38.

Demodulator 18 comprises a detector (not shown) that recovers electrical information signal $S_I$ from electrical output signal $S_O$ as is known in the art. In an example, the detector rectifies and integrates electrical output signal $S_O$ to recover electrical information signal $S_I$. Typically, in an embodiment intended for applications in which electrical information signal $S_I$ is a digital signal, demodulator 18 additionally includes a clock and data recovery (CDR) circuit following the detector. The CDR circuit operates to clean up the waveform of the raw electrical information signal recovered from the electrical output signal $S_O$ to generate recovered electrical information signal $S_R$. Demodulator 18 provides the recovered electrical information signal $S_R$ to the output terminals 38, 36 of acoustic galvanic isolator 10.

Circuits suitable for use as local oscillator 12, modulator 14 and demodulator 18 of acoustic galvanic isolator 10 are known in the art. Consequently, local oscillator 12, modulator 14 and demodulator 18 will not be described in further detail.

In the embodiment shown in FIG. 1, local oscillator 12 is shown as part of acoustic galvanic isolator 10. In other embodiments, instead of a local oscillator, acoustic galvanic isolator 10 has carrier signal input terminals (not shown) via which the acoustic galvanic isolator receives the carrier signal $S_C$ from an external carrier signal generator. In such embodiments, the carrier signal input terminals provide the carrier signal source for the acoustic galvanic isolator.

Acoustic couplers in according with embodiments of the invention that can be used as electrically-isolating acoustic coupler 16 in acoustic galvanic isolator 10 will now be described. Such embodiments all have a band-pass frequency response, as will be described in more detail below with reference to FIG. 3. The pass-band of the acoustic coupler is characterized by a center frequency and a bandwidth. The bandwidth of the pass-band determines the maximum data rate of the information signal that can be acoustically coupled by the acoustic coupler. For simplicity, the center frequency of the pass band of the acoustic coupler will be referred to as the center frequency of the acoustic coupler. As will be described further below, the acoustic coupler embodiments are composed in part of layers of various acoustically-transmissive materials whose thickness depends on the wavelength in the acoustically-transmissive material of an acoustic signal nominally equal in frequency to the center frequency of the acoustic coupler. In acoustic galvanic isolator 10 shown in FIG. 1, the frequency of carrier signal $S_C$ is nominally equal to the center frequency of the acoustic coupler used as electrically-isolating acoustic coupler 16.

In this disclosure, the term quarter-wave layer will be used to denote a layer of acoustically-transmissive material having a nominal thickness t equal to an odd integral multiple of one quarter of the wavelength in the material of an acoustic signal nominally equal in frequency to the center frequency of the acoustic coupler, i.e.:

$$t \approx (2m+1)\lambda_n/4 \qquad (1)$$

where $\lambda_n$ is the wavelength of the above-mentioned acoustic signal in the acoustically-transmissive material and m is an integer equal to or greater than zero. The thickness of a quarter-wave layer may differ from the nominal thickness by approximately ±10% of $\lambda_n/4$. A thickness outside this tolerance range can be used with some degradation in performance, but the thickness of a quarter-wave layer always differs significantly from an integral multiple of $\lambda_n/2$.

Moreover, in this disclosure, a quarter wave layer having a thickness equal to a specific number of quarter wavelengths of the above-mentioned acoustic signal in the material of the layer will be denoted by preceding the term quarter-wave layer by a number denoting the number of quarter wavelengths. For example, the term one quarter-wave layer will be used to denote a layer of acoustically-transmissive material having a nominal thickness t equal to one quarter of the wavelength in the material of an acoustic signal equal in frequency to the center frequency of the acoustic coupler, i.e., $t \approx \lambda_n/4$ (m=0 in equation (1)). A one quarter-wave layer is a quarter-wave layer of a least-possible thickness. Similarly, a three quarter-wave layer has a nominal thickness t equal to three quarters of the wavelength in the material of the above-mentioned acoustic signal, i.e., $t \approx 3\lambda_n/4$ (m=1 in equation (1)).

Acoustic galvanic isolators and their constituent electrically-isolating acoustic couplers are characterized by a breakdown voltage. The breakdown voltage of an acoustic galvanic isolator is the voltage that, when applied between the input terminals and output terminals of the acoustic galvanic isolator, causes a leakage current greater than a threshold leakage current to flow. In acoustic galvanic isolators with multiple input terminals and multiple output terminals, as in this disclosure, the input terminals are electrically connected to one another and the output terminals are electrically connected to one another to make the breakdown voltage measurement. The breakdown voltage of an electrically-isolating acoustic coupler is the voltage that, when applied between the inputs and outputs of the acoustically-resonant electrical insulator, causes a leakage current greater than a threshold leakage current to flow. In electrically-isolating acoustic couplers with multiple inputs and multiple outputs, as in this disclosure, the inputs are electrically connected to one another and the outputs are electrically connected to one another to make the breakdown voltage measurement. The threshold leakage current is application-dependent, and is typically of the order of microamps.

Figure 2:
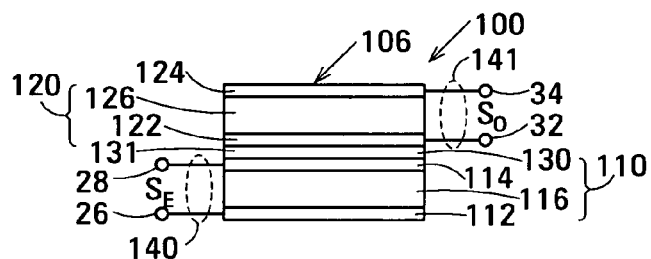
FIG. 2 is a schematic diagram showing an example of an acoustic coupler that may be used as the electrically-isolating acoustic coupler of the acoustic galvanic isolator shown in FIG. 1.

FIG. 2 is a schematic diagram showing an example of an acoustic coupler 100 in accordance with the invention. Acoustic coupler 100 comprises a single decoupled stacked bulk acoustic resonator (DSBAR) 106, inputs 26, 28, outputs 32, 34, an electrical circuit 140 that connects DSBAR 106 to inputs 26, 28 and an electrical circuit 141 that connects DSBAR 106 to outputs 32, 34. DSBAR 106 incorporates an electrically-insulating acoustic decoupler 130 that provides electrical isolation between inputs 26, 28 and outputs 32, 34.

When used as electrically-isolating acoustic coupler 16 in acoustic galvanic isolator 10 shown in FIG. 1, acoustic coupler 100 acoustically couples modulated electrical signal $S_M$ from inputs 26, 28 to outputs 32, 34 while providing electrical isolation between inputs 26, 28 and outputs 32, 34. Thus, acoustic coupler 100 effectively galvanically isolates output terminals 36, 38 from input terminals 22, 24, and allows the output terminals to differ in voltage from the input terminals by a voltage up to its specified breakdown voltage.

In acoustic coupler 100, DSBAR 106 is composed of a lower film bulk acoustic resonator (FBAR) 110, an upper FBAR 120 stacked on FBAR 110, and an electrically-insulating acoustic decoupler 130 between lower FBAR 110 and upper FBAR 120. FBAR 110 is composed of opposed planar electrodes 112 and 114 and a piezoelectric element 116 between the electrodes. FBAR 120 is composed of opposed planar electrodes 122 and 124 and a piezoelectric element 126 between the electrodes. Acoustic decoupler 130 is located between electrode 114 of FBAR 110 and electrode 122 of FBAR 120. Electrical circuit 140 electrically connects electrodes 112 and 114 of FBAR 110 to inputs 26, 28, respectively. Electrical circuit 141 electrically connects electrodes 122 and 124 of FBAR 120 to outputs 32, 34, respectively.

Modulated electrical signal $S_M$ received at inputs 26, 28 applies a voltage between electrodes 112 and 114 of FBAR 110. FBAR 110 converts the modulated electrical signal $S_M$ to an acoustic signal. Specifically, the voltage applied to piezoelectric element 116 by electrodes 112 and 114 mechanically deforms piezoelectric element 116, which causes FBAR 110 to vibrate mechanically at the frequency of the modulated electrical signal. Electrically-insulating acoustic coupler 130 couples part of the acoustic signal generated by FBAR 110 to FBAR 120. Additionally, electrically-insulating acoustic decoupler 130 is electrically insulating and therefore electrically isolates FBAR 120 from FBAR 110. FBAR 120 receives the acoustic signal coupled by acoustic decoupler 130 and converts the acoustic signal back into an electrical signal that appears across piezoelectric element 126. The electrical signal is picked up by electrodes 122 and 124 and is fed to outputs 32, 34, respectively, as electrical output signal $S_O$. Electrical output signal $S_O$ appearing between outputs 32, 34 has the same frequency and includes the information content of the modulated electrical signal $S_M$ applied between inputs 26, 28. Thus, acoustic coupler 100 effectively acoustically couples the modulated electrical signal $S_M$ from inputs 26, 28 to outputs 32, 34.

Acoustic decoupler 130 controls the coupling of the acoustic signal generated by FBAR 110 to FBAR 120 and, hence, the bandwidth of acoustic coupler 100. Specifically, due to a substantial mis-match in acoustic impedance between the acoustic decoupler and FBARs 110 and 120, the acoustic decoupler couples less of the acoustic signal generated by FBAR 110 to FBAR 120 than would be coupled by direct contact between the FBARs.

Figure 3:
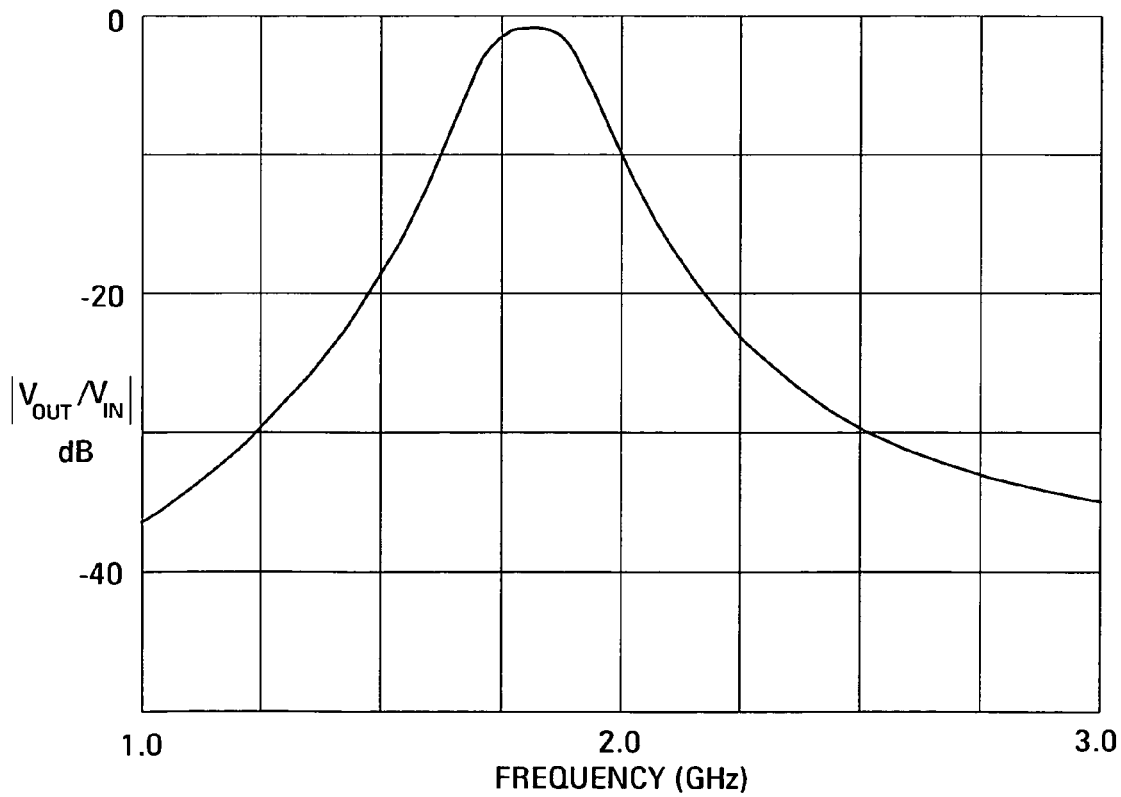
FIG. 3 is a graph showing the frequency response characteristic of an exemplary embodiment of the decoupled stacked bulk acoustic resonator (DSBAR) that forms part of the acoustic coupler shown in FIG. 2.

FIG. 3 shows the frequency response characteristic of an exemplary embodiment of DSBAR 106. DSBAR 106 exhibits a flat in-band response with a pass bandwidth of greater than 100 MHz, which is sufficiently broad to transmit the full bandwidth of an embodiment of modulated electrical signal $S_M$ resulting from modulating carrier signal $S_C$ with an embodiment of electrical information signal $S_I$ having a data rate greater than 100 Mbit/s. The frequency response of DSBAR 106 additionally exhibits a sharp roll-off outside the pass band.

Figure 4A:
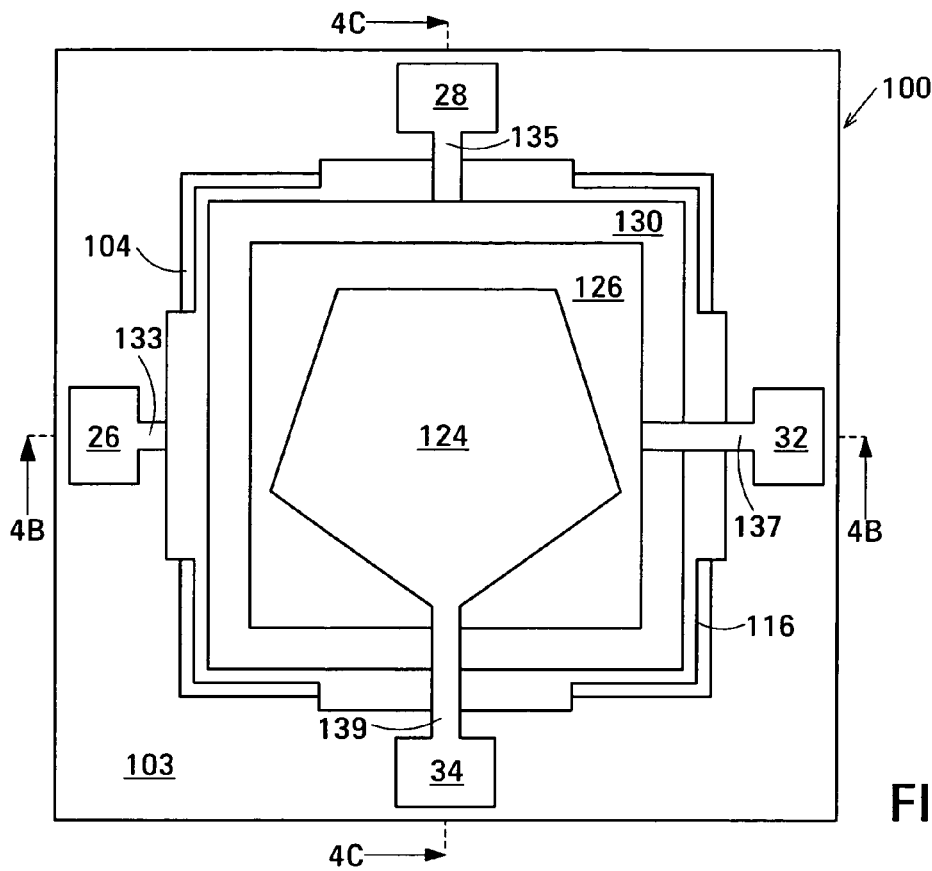
FIG. 4A is a plan view showing a practical example of the acoustic coupler shown in FIG. 2.
Figure 4B:
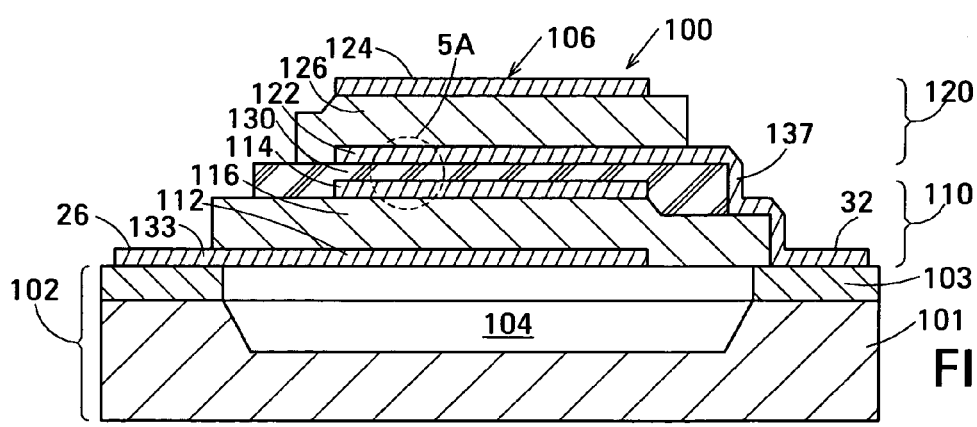
FIGS. 4B and 4C are cross-sectional views along section lines 4B-4B and 4C-4C, respectively, shown in FIG. 4A.
Figure 4C:
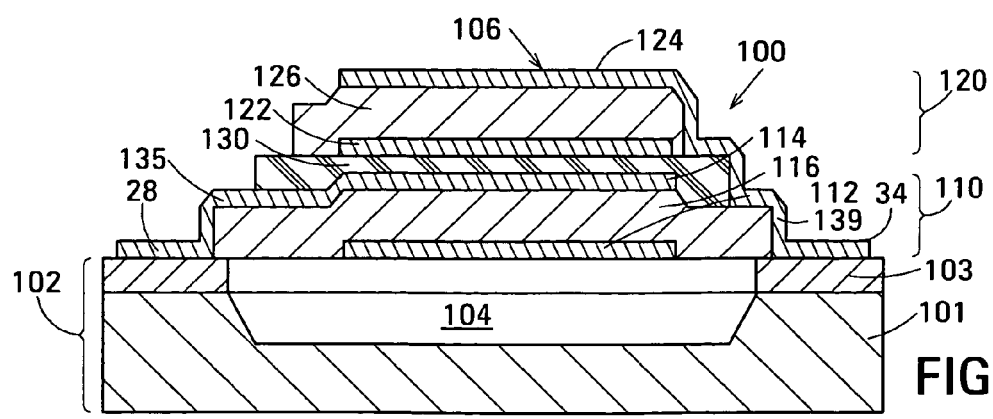

FIG. 4A is a plan view showing a practical example of acoustic coupler 100. FIGS. 4B and 4C are cross-sectional views along section lines 4B-4B and 4C-4C, respectively, shown in FIG. 4A. The same reference numerals are used to denote the elements of acoustic coupler 100 in FIG. 2 and in FIGS. 4A-4C.

In the embodiment of acoustic coupler 100 shown in FIGS. 4A-4C, DSBAR 106 is suspended over a cavity 104 defined in a substrate 102. Suspending DSBAR 106 over a cavity allows the stacked FBARs 110 and 120 constituting DSBAR 106 to resonate mechanically in response to modulated electrical signal $S_M$. Other suspension schemes that allow the stacked FBARs to resonate mechanically are possible. For example, DSBAR 106 can be acoustically isolated from substrate 102 by an acoustic Bragg reflector (not shown), as described by John D. Larson III et al. in United States patent application publication No. 2005 0 104 690 entitled *Cavity-Less Film Bulk Acoustic Resonator (FBAR) Devices*, assigned to the assignee of this disclosure and incorporated by reference.

In the example shown in FIGS. 4A-4C, the material of substrate 102 is single-crystal silicon. Since single-crystal silicon is a semiconductor, and is therefore not a good electrical insulator, substrate 102 is typically composed of a base layer 101 of single crystal silicon and an insulating layer 103 of a dielectric material located on the major surface of the base layer. Exemplary materials of the insulating layer include aluminum nitride, silicon nitride, polyimide, a crosslinked polyphenylene polymer and any other suitable electrically-insulating material. Insulating layer 103 insulates DSBAR 106 from base layer 101. Alternatively, the material of substrate 102 can be a ceramic material, such as alumina, that has a very high electrical resistivity and breakdown field.

In the embodiment of acoustic coupler 100 shown in FIGS. 4A-4C, inputs 26, 28 shown in FIG. 2 are embodied as terminal pads 26 and 28, respectively, located on the major surface of substrate 102. Electrical circuit 140 shown in FIG. 2 is composed of an electrical trace 133 that extends from terminal pad 26 to electrode 112 of FBAR 110 and an electrical trace 135 that extends from terminal pad 28 to electrode 114 of FBAR 110. Electrical trace 133 extends over part of the major surface of substrate 102 and under part of piezoelectric element 116 and electrical trace 135 extends over part of the major surface of substrate 102 and over part of piezoelectric element 116. Outputs 32, 34 are embodied as terminal pads 32 and 34, respectively, located on the major surface of substrate 102. Electrical circuit 141 shown in FIG. 2 is composed of an electrical trace 137 that extends from terminal pad 32 to electrode 122 of FBAR 120 and an electrical trace 139 that extends from terminal pad 34 to electrode 124 of FBAR 120. Electrical trace 137 extends over parts of the major surfaces of acoustic decoupler 130, piezoelectric element 116 and substrate 102. Electrical trace 139 extends over parts of the major surfaces of piezoelectric element 126, acoustic decoupler 130, piezoelectric element 116 and substrate 102.

In embodiments in which local oscillator 12, modulator 14 and demodulator 18 are fabricated in and on substrate 102, terminal pads 26, 28, 32 and 34 are typically omitted and electrical traces 133 and 135 are extended to connect to corresponding traces constituting part of modulator 14 and electrical traces 137 and 139 are extended to connect to corresponding traces constituting part of demodulator 18.

Figure 5A:
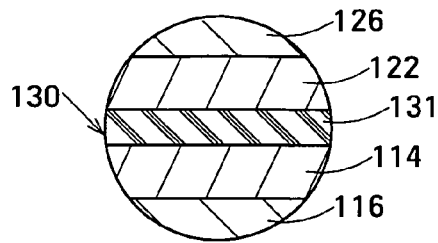
FIG. 5A is an enlarged view of the portion marked 5A in FIG. 4B showing a first embodiment of the acoustic decoupler.

FIG. 5A is an enlarged view of the portion marked 5A in FIG. 4B showing a first embodiment of electrically-insulating acoustic decoupler 130. In the embodiment shown in FIG. 5A, acoustic decoupler 130 is composed of an acoustic decoupling layer 131 of electrically-isolating acoustic decoupling material located between the electrodes 114 and 122 of FBARs 110 and 120, respectively. The acoustic decoupling material of acoustic decoupling layer 131 has an acoustic impedance intermediate between that of air and that of the materials of FBARs 110 and 120, and additionally has a high electrical resistivity and a high breakdown field.

The acoustic impedance of a material is the ratio of stress to particle velocity in the material and is measured in Rayleighs, abbreviated as rayl. The piezoelectric material of the piezoelectric elements 116 and 126 of FBARs 110 and 120, respectively is typically aluminum nitride (AlN) and the material of electrodes 112, 114, 122 and 124 is typically molybdenum (Mo). The acoustic impedance of AlN is typically about 35 Mrayl and that of molybdenum is about 63 Mrayl. The acoustic impedance of air is about 1 krayl.

Typically, the acoustic impedance of the electrically-isolating acoustic decoupling material of acoustic decoupling layer 131 is about one order of magnitude less that of the piezoelectric material that constitutes the piezoelectric elements 116 and 126 of FBARs 110 and 120, respectively. The bandwidth of the pass band of acoustic coupler 100 depends on the difference in acoustic impedance between the acoustic decoupling material of acoustic decoupling layer 131 and the materials of FBARs 110 and 120. In embodiments of acoustic decoupler 100 in which the materials of FBARs 110 and 120 are as stated above, acoustic decoupling materials with an acoustic impedance in the range from about 2 Mrayl to about 8 Mrayl will result in acoustic decoupler having a pass bandwidth sufficient to allow acoustic galvanic isolator 10 (FIG. 1) to operate at data rates greater than 100 Mb/s.

In the embodiment of acoustic decoupler 130 shown in FIG. 5A, acoustic decoupling layer 131 is a quarter-wave layer. For a given acoustic decoupling material, the electrical breakdown field of the acoustic decoupling material of acoustic decoupling layer 131 and the thickness of acoustic decoupling layer 131 are the main factors that determine the breakdown voltage of acoustic coupler 100 and, hence, the breakdown voltage of acoustic galvanic isolator 10 between the input terminals 22, 24 and the output terminals 36, 38. However, an embodiment of acoustic coupler 100 in which the acoustic decoupling layer 131 is thicker than a one quarter-wave layer typically has a frequency response that exhibits spurious response artifacts due to the ability of such a thicker acoustic decoupling layer to support multiple acoustic modes. The spurious response artifacts tend to reduce the opening of the "eye" of the electrical output signal $S_O$ output by acoustic coupler 100. To ensure the accuracy of the recovered electrical information signal $S_R$ output by acoustic galvanic isolator 10 (FIG. 1), embodiments in which acoustic coupler 100 has a layer thicker than a one quarter-wave layer as acoustic decoupling layer 131 typically need a more sophisticated type of clock and data recovery circuit in demodulator 18 than embodiments in which acoustic coupler 100 has a one quarter-wave layer (m=0) as acoustic decoupling layer 131. Embodiments of acoustic coupler 100 in which acoustic decoupling layer 131 is a one quarter wave layer couple modulated electrical signal $S_M$ from inputs 26, 28 to outputs 32, 34 with optimum signal integrity.

In some embodiments, acoustic decoupling layer 131 is formed by spin coating a liquid precursor for the acoustic decoupling material over electrode 114. An acoustic decoupling layer formed by spin coating will typically have regions of different thickness due to the contouring of the surface coated by the acoustic decoupling material. In such embodiment, the thickness of acoustic decoupling layer 131 is the thickness of the portion of the acoustic decoupling layer located between electrodes 114 and 122.

Many materials are electrically insulating, have high breakdown fields and have acoustic impedances in the range stated above. Additionally, many such materials can be applied in layers of uniform thickness in the thickness ranges stated above. Such materials are therefore potentially suitable for use as the acoustic decoupling material of acoustic decoupling layer 131 of acoustic decoupler 130. However, the acoustic decoupling material must also be capable of withstanding the high temperatures of the fabrication operations performed after acoustic decoupling layer 131 has been deposited on electrode 114 to form acoustic decoupler 130. In practical embodiments of acoustic coupler 100, electrodes 122 and 124 and piezoelectric layer 126 are deposited by sputtering after the acoustic decoupling material has been deposited. Temperatures as high as 400° C. are reached during these deposition processes. Thus, a material that remains stable at such temperatures is used as the acoustic decoupling material.

Typical acoustic decoupling materials have a very high acoustic attenuation per unit length compared with the materials of FBARs 110 and 120. However, since the above-described embodiment of electrically-insulating acoustic decoupler 130 is composed of acoustic decoupling layer 131 of acoustic decoupling material typically less than 1 μm thick, the acoustic attenuation introduced by acoustic decoupling layer 131 of acoustic decoupling material is typically negligible.

In one embodiment, a polyimide is used as the acoustic decoupling material of acoustic decoupling layer 131. Polyimide is sold under the trademark Kapton® by E. I. du Pont de Nemours and Company. In such embodiment, acoustic decoupler 130 is composed of acoustic decoupling layer 131 of polyimide applied to electrode 114 by spin coating. Polyimide has an acoustic impedance of about 4 Mrayl and a breakdown field of about 165 kV/mm.

In another embodiment, a poly(para-xylylene) is used as the acoustic decoupling material of acoustic decoupling layer 131. In such embodiment, acoustic decoupler 130 is composed of acoustic decoupling layer 131 of poly(para-xylylene) applied to electrode 114 by vacuum deposition. Poly (para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl and a breakdown field of about 275 kV/mm.

In another embodiment, a crosslinked polyphenylene polymer is used as the acoustic decoupling material of acoustic decoupling layer 131. In such embodiment, acoustic decoupler 130 is composed of acoustic decoupling layer 131 of a crosslinked polyphenylene polymer the precursor solution for which is applied to electrode 114 by spin coating. Crosslinked polyphenylene polymers have been developed as low dielectric constant dielectric materials for use in integrated circuits and consequently remain stable at the high temperatures to which the acoustic decoupling material is subject during the subsequent fabrication of FBAR 120. Crosslinked polyphenylene polymers additionally have a calculated acoustic impedance of about 2 Mrayl. This acoustic impedance is in the range of acoustic impedances that provides acoustic coupler 100 with a pass bandwidth sufficient for operation at data rates of over 100 Mbit/s.

Precursor solutions containing various oligomers that polymerize to form respective crosslinked polyphenylene polymers are sold by The Dow Chemical Company, Midland, Mich., under the registered trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl. This crosslinked polyphenylene polymer has a breakdown field of about 400 kV/mm.

The oligomers that polymerize to form crosslinked polyphenylene polymers are prepared from biscyclopentadienone—and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect*, 12 ADVANCED MATERIALS, 1769 (2000), also incorporated by reference. Compared with polyimide, crosslinked polyphenylene polymers are lower in acoustic impedance, lower in acoustic attenuation, lower in dielectric constant and higher in breakdown field. Moreover, a spun-on layer of the precursor solution is capable of producing a high-quality film of the crosslinked polyphenylene polymer with a thickness of the order of 200 nm, which is a typical thickness of acoustic decoupling layer 131.

In an alternative embodiment, the acoustic decoupling material of acoustic decoupling layer 131 providing acoustic decoupler 130 is an electrically-insulating material whose acoustic impedance is substantially greater than that of the materials of FBARs 110 and 120. No materials having this property are known at this time, but such materials may become available in future, or lower acoustic impedance FBAR materials may become available in future. The thickness of acoustic decoupling layer 131 of such high acoustic impedance acoustic decoupling material is as described above.

Figure 5B:
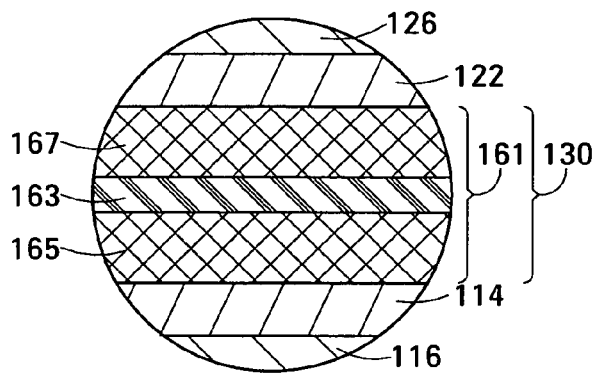
FIG. 5B is an enlarged view of the portion marked 5A in FIG. 4B showing a second embodiment of the acoustic decoupler.

FIG. 5B is an enlarged view of the portion marked 5A in FIG. 4B showing a second embodiment of electrically-insulating acoustic decoupler 130. In the embodiment shown in FIG. 5B, acoustic decoupler 130 is composed of an electrically-insulating acoustic Bragg structure 161. Electrically-insulating acoustic Bragg structure 161 comprises a low acoustic impedance Bragg element 163 located between high acoustic impedance Bragg elements 165 and 167. At least one of the Bragg elements 163, 165 and 167 of Bragg structure 161 comprises a layer of material having a high electrical resistivity, a low dielectric permittivity and a high breakdown field. Low acoustic impedance Bragg element 163 is a quarter-wave layer of a low acoustic impedance material whereas high acoustic impedance Bragg elements 165 and 167 are each a quarter-wave layer of high acoustic impedance material. The acoustic impedances of the materials of the Bragg elements are characterized as "low" and "high" with respect to one another and with respect to the acoustic impedance of the piezoelectric material of piezoelectric elements 116 and 126.

In one embodiment, low acoustic impedance Bragg element 163 is a quarter-wave layer of silicon dioxide ($SiO_2$), which has an acoustic impedance of about 13 Mrayl, and each of the high acoustic impedance Bragg elements 165 and 167 is a quarter-wave layer of the same material as electrodes 114 and 122, respectively, e.g., molybdenum, which has an acoustic impedance of about 63 Mrayl. Using the same material for high acoustic impedance Bragg element 165 and electrode 114 of FBAR 110 allows high acoustic impedance Bragg element 165 additionally to serve as electrode 114.

In an example, high acoustic impedance Bragg elements 165 and 167 are one quarter-wave layers of molybdenum, and low acoustic impedance Bragg element 163 is a one quarter-wave layer of $SiO_2$. In an embodiment in which the frequency of carrier signal $S_C$ is about 1.9 MHz, molybdenum high acoustic impedance Bragg elements 165 and 167 have a thickness of about 820 nm and $SiO_2$ low acoustic impedance Bragg element 163 has a thickness of about 260 nm.

One example of an alternative material for low acoustic impedance Bragg element 163 is a crosslinked polyphenylene polymer such as the above-mentioned crosslinked polyphenylene polymer made from a precursor solution sold under the registered trademark SiLK by Dow Chemical Co. Other examples of alternative electrically-insulating materials for low acoustic impedance Bragg element 163 include zirconium oxide ($ZrO_2$), hafnium oxide (HfO), yttrium aluminum garnet (YAG), titanium dioxide ($TiO_2$) and various glasses. Alternative materials for high impedance Bragg elements 165 and 167 include such metals as titanium (Ti), niobium (Nb), ruthenium (Ru) and tungsten (W).

In the example just described, only one of the Bragg elements 163, 165 and 167 is insulating, and the breakdown voltage of acoustic coupler 100, and, hence, the breakdown voltage of acoustic galvanic isolator 10, are determined by the thickness of low acoustic impedance Bragg element 163 and the breakdown field of the material of low acoustic impedance Bragg element 163.

The breakdown voltage of acoustic coupler 100 can be increased by making all the Bragg elements 163, 165 and 167 constituting Bragg structure 161 of electrically-insulating material. In one exemplary embodiment, high acoustic impedance Bragg elements 163 and 167 are each a quarter-wave layer of silicon dioxide and low impedance Bragg element 165 is a quarter-wave layer of a crosslinked polyphenylene polymer, such as the above-mentioned crosslinked polyphenylene polymer made from a precursor solution sold under the registered trademark SiLK by Dow Chemical Co. However, silicon dioxide has a relatively low breakdown field of about 30 kV/mm, and a quarter-wave layer of a typical crosslinked polyphenylene polymer is relatively thin due to the relatively low velocity of sound of this material. In another all-insulating embodiment of Bragg structure 161 having a substantially greater breakdown voltage, high acoustic impedance Bragg elements 163 and 167 are each a quarter-wave layer of aluminum oxide ($Al_2O_3$) and low impedance Bragg element 165 is a quarter-wave layer of silicon dioxide. Aluminum oxide has an acoustic impedance of about 44 Mrayl and a breakdown field of several hundred kilovolts/mm. Additionally, the velocity of sound in aluminum oxide is about seven times higher than in a typical crosslinked polyphenylene polymer. A given voltage applied across two quarter-wave layers of aluminum oxide and a quarter wave layer of silicon dioxide results in a much lower electric field than when applied across two quarter-wave layers of silicon dioxide and one quarter-wave layer of a crosslinked polyphenylene polymer.

Examples of alternative electrically-insulating materials for Bragg elements 163, 165 and 167 include zirconium oxide ($ZrO_2$), hafnium oxide (HfO), yttrium aluminum garnet (YAG), titanium dioxide ($TiO_2$) and various glasses. The above examples are listed in an approximate order of descending acoustic impedance. Any of the examples may be used as the material of the high acoustic impedance Bragg layers 163, 167 provided that the acoustic impedance of the material of the low acoustic impedance Bragg layer 165 is less.

In embodiments of acoustic decoupler 130 in which the acoustic impedance difference between high acoustic impedance Bragg elements 165 and 167 and low acoustic impedance Bragg element 163 is relatively low, Bragg structure 161 may be composed of more than one (n) low acoustic impedance Bragg element interleaved with a corresponding number (n+1) of high acoustic impedance Bragg elements. For example, Bragg structure 161 may be composed of two low acoustic impedance Bragg elements interleaved with three high acoustic impedance Bragg elements. While only one of the Bragg elements need be electrically insulating, embodiments of acoustic coupler 100 in which more than one of the Bragg elements are electrically insulating have a higher breakdown voltage.

Thousands of acoustic galvanic isolators similar to acoustic galvanic isolator 10 are fabricated at a time by wafer-scale fabrication. Such wafer-scale fabrication makes the acoustic galvanic isolators inexpensive to fabricate. The wafer is selectively etched to define a cavity in the location of the acoustic coupler 100 of each acoustic galvanic isolator to be fabricated on the wafer. The cavities are filled with sacrificial material and the surface of the wafer is planarized. The local oscillator 12, modulator 14 and demodulator 18 of each acoustic galvanic isolator to be fabricated on the wafer are fabricated in and on the surface of the wafer using conventional CMOS fabrication processing. The fabricated circuit elements are then covered with a protective layer aluminum nitride or silicon nitride. Acoustic couplers similar to acoustic coupler 100 are then fabricated by sequentially depositing and patterning layers of electrode material, piezoelectric material and acoustic decoupling material or acoustic Bragg structure materials to form the DSBAR 106 and the electrical circuits 140 and 141 of each acoustic coupler. Electrical circuits 140 and 141 connect the DSBAR to exposed connection points on modulator 14 and demodulator 18.

After the acoustic couplers have been fabricated, the sacrificial material is removed to leave each constituent DSBAR suspended over its respective cavity. Access holes shown at 119 provide access to the sacrificial material to facilitate removal. The protective material is then removed from the fabricated circuit elements. The substrate is then divided into individual acoustic galvanic isolators each similar to acoustic galvanic isolator 100. An exemplary process by which the acoustic couplers 100 may be fabricated is described in more detail in United States patent application publication No. 2005 0 140 466, assigned to the assignee of this disclosure and incorporated by reference.

Alternatively, acoustic couplers 100 are fabricated on a different wafer from that on which local oscillator 12, modulator 14 and demodulator 18 are fabricated. In this case, the acoustic galvanic isolators may be made by using a wafer bonding process to join the respective wafers to form a structure similar to that described by John D. Larson III et al. with reference to FIGS. 8A-8E of United States patent application publication No. 2005 0 093 659, assigned to the assignee of this disclosure and incorporated by reference. In a further alternative, the local oscillators 12, modulators 14 and acoustic couplers 100 are fabricated on one wafer and corresponding demodulators 18 are fabricated on the other wafer. The wafers are then bonded together as just described to form the acoustic galvanic isolators. Alternatively, the local oscillators 12 and modulators 14 are fabricated on one wafer and the acoustic couplers 100 and demodulators 18 are fabricated on the other wafer. The wafers are then bonded together as just described to form the acoustic galvanic isolators.

In another alternative suitable for use in applications in which the acoustic galvanic isolators are specified to have a large breakdown voltage between input terminals 22, 24 and output terminals 36, 38, multiple input circuits each comprising an instance of local oscillator 12 and an instance of modulator 14 and multiple output circuits each comprising an instance of demodulator 18 are fabricated in and on a semiconductor wafer. The wafer is then singulated into individual semiconductor chips each embodying a single input circuit or a single output circuit. The electrically-isolating acoustic coupler 16 of each acoustic galvanic isolator is fabricated suspended over a cavity defined in a ceramic wafer having conductive traces located on its major surface. For each acoustic galvanic isolator fabricated on the wafer, one semiconductor chip embodying an input circuit and one semiconductor chip embodying an output circuit are mounted on the ceramic wafer in electrical contact with the conductive traces. For example, the semiconductor chips may be mounted on the ceramic wafer by ball bonding or flip-chip bonding. Ceramic wafers with attached semiconductor chips can also be used in the above-described two wafer structure.

In an exemplary embodiment of acoustic galvanic isolator 10 operating at a carrier frequency of about 1.9 GHz, the material of electrodes 112, 114, 122 and 124 is molybdenum. Each of the electrodes has a thickness of about 300 nm and is pentagonal in shape with an area of about 12,000 square µm. A different area gives a different characteristic impedance. The asymmetrical shape of the electrodes minimizes lateral modes in FBARs 110 and 120, as described by Larson III et al. in U.S. Pat. No. 6,215,375, assigned to the assignee of this disclosure and incorporated by reference. The metal layers in which electrodes 112, 114, 122 and 124 are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position. Alternative electrode materials include tungsten, niobium and titanium. The electrodes may have a multi-layer structure.

The material of piezoelectric elements 116 and 126 is aluminum nitride. Each piezoelectric element has a thickness of about 1.4 μm. Alternative piezoelectric materials include zinc oxide, cadmium sulfide and poled ferroelectric materials such as perovskite ferroelectric materials, including lead zirconium titanate, lead metaniobate and barium titanate.

The acoustic decoupling material constituting acoustic decoupling layer 131 in the embodiment of acoustic decoupler 130 described above with reference to FIG. 5A is polyimide, parylene or a crosslinked polyphenylene polymer. A one quarter-wave layer of polyimide is about 100 nm thick whereas a one quarter-wave layer of crosslinked polyphenylene polymer is about 190 nm thick. As noted above, the acoustic decoupling layer 131 may have a thickness of three, five or more times the above-specified one quarter-wave layer thickness. Suitable materials for use in embodiments in which acoustic decoupler 130 is embodied as an acoustic Bragg structure are described above.

In the above-described example of acoustic galvanic isolator 10, inputs 26, 28 are connected to FBAR 110 and outputs 32, 34 are connected to FBAR 120 stacked on FBAR 110. In other embodiments, the direction in which the acoustic signal flows is reversed, and outputs 32, 34 are connected to FBAR 110 and inputs 26, 28 are connected to FBAR 120 stacked on FBAR 110.

Figure 6:
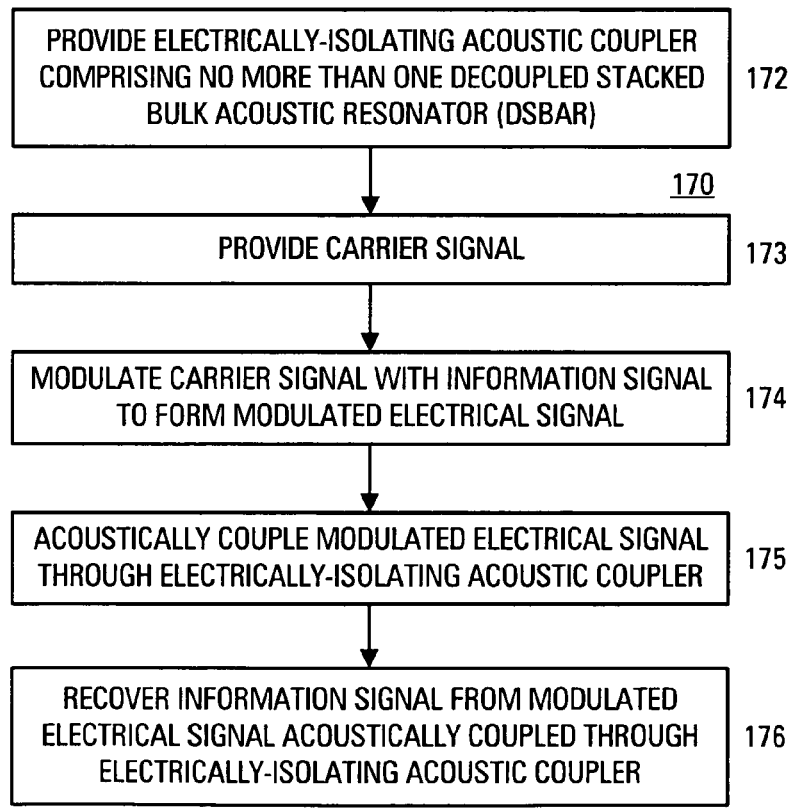
FIG. 6 is a flow chart showing an example of a method in accordance with an embodiment of the invention for galvanically isolating an information signal.

FIG. 6 is a flow chart showing an example of a method 170 in accordance with an embodiment of the invention for galvanically isolating an information signal. In block 172, an electrically-isolating acoustic coupler is provided. The electrically-isolating acoustic coupler comprises no more than one decoupled stacked bulk acoustic resonator (DSBAR). In block 173, a carrier signal is provided. In block 174, the carrier signal is modulated with the information signal to form a modulated electrical signal. In block 175, the modulated electrical signal is acoustically coupled through the electrically-isolating acoustic coupler. In block 176, the information signal is recovered from the modulated electrical signal acoustically coupled though the acoustic coupler.

This disclosure describes the invention in detail using illustrative embodiments. However, the invention defined by the appended claims is not limited to the precise embodiments described.

I claim:

1. An acoustic galvanic isolator, comprising:
a carrier signal source;
a modulator connected to receive an information signal and the carrier signal;
a demodulator; and
connected between the modulator and the demodulator, an electrically-isolating acoustic coupler comprising exactly one decoupled stacked bulk acoustic resonator (DSBAR),
wherein the DSBAR comprises a first film bulk acoustic resonator (FBAR), a second FBAR, and an electrically-insulating acoustic decoupler between the FBARs, and
wherein the electrically-insulating acoustic decoupler comprises at least one of: (1) an electrically-insulating acoustic Bragg structure; (2) a quarter-wave thick layer of acoustic coupling material; and (3) at least one layer of crosslinked polyphenylene polymer.

2. The acoustic galvanic isolator of claim 1, additionally comprising:
a first electrical circuit electrically connecting the modulator to the first FBAR; and
a second electrical circuit electrically connecting the demodulator to the second FBAR.

3. The acoustic galvanic isolator of claim 2, in which:
each FBAR comprises opposed planar electrodes and a piezoelectric element between the electrodes;
the first electrical circuit electrically connects the modulator to the electrodes of the first FBAR; and
the second electrical circuit electrically connects demodulator to the electrodes of the second FBAR.

4. The acoustic galvanic isolator of claim 1, wherein the electrically-insulating acoustic decoupled comprises the electrically-insulating acoustic Bragg structure, and wherein the electrically-insulating acoustic Bragg structure comprises first, second, and third Bragg elements, the second Bragg element being disposed in between the first and third Bragg elements and having a lower acoustic impedance than the first and third Bragg elements, respectively, at least one of the Bragg elements comprising a layer of electrically-insulating material.

5. The acoustic galvanic isolator of claim 4, wherein the first Bragg element is a quarter-wave thick layer of a same material as an electrode of the first FBAR, and the third Bragg element is a quarter-wave thick layer of a same material as an electrode of the second FBAR.

6. The acoustic galvanic isolator of claim 1, wherein the electrically-insulating acoustic decoupler comprises the electrically-insulating acoustic Bragg structure, and wherein the electrically-insulating acoustic Bragg structure comprises one or more layers of crosslinked polyphenylene polymer interleaved with layers of silicon dioxide.

7. The acoustic galvanic isolator of claim 1, wherein the electrically-insulating acoustic decoupler comprises the quarter-wave thick layer of acoustic coupling material.

8. The acoustic galvanic isolator of claim 1, wherein the electrically-insulating acoustic decoupler comprises the at least one layer of crosslinked polyphenylene polymer.

9. A method for galvanically isolating an information signal, the method comprising:
providing an electrically-isolating acoustic coupler comprising exactly one decoupled stacked bulk acoustic resonator (DSBAR), the DSBAR comprising a first film bulk acoustic resonator (FBAR), a second FBAR, and an electrically-insulating acoustic decoupler between the FBARs, wherein the electrically-insulating acoustic decoupler comprises at least one of: (1) an electrically-insulating acoustic Bragg structure; (2) a quarter-wave thick layer of acoustic coupling material; and (3) at least one layer of crosslinked polyphenylene polymer;
providing a carrier signal;
modulating the carrier signal with the information signal to form a modulated electrical signal;
acoustically coupling the modulated electrical signal through the electrically-isolating acoustic coupler; and
recovering the information signal from the modulated electrical signal acoustically coupled through the electrically-isolating acoustic coupler.

10. The method of claim 9, in which the recovering comprises performing clock and data recovery on the modulated electrical signal acoustically coupled through the electrically-isolating acoustic coupler.

11. The method of claim 9, wherein the electrically-insulating acoustic decoupler comprises the electrically-insulating acoustic Bragg structure, and wherein the electrically-insulating acoustic Bragg structure comprises first, second, and third Bragg elements, the second Bragg element being disposed in between the first and third Bragg elements and having a lower acoustic impedance than the first and third Bragg elements, respectively, at least one of the Bragg elements comprising a layer of electrically-insulating material.

12. The method of claim 11, wherein the first Bragg element is a quarter-wave thick layer of a same material as an electrode of the first FBAR, and the third Bragg element is a quarter-wave thick layer of a same material as an electrode of the second FBAR.

13. The method of claim 9, wherein the electrically-insulating acoustic decoupler comprises the quarter-wave thick layer of acoustic coupling material.

14. The method of claim 9, wherein the electrically-insulating acoustic decoupler comprises the at least one layer of crosslinked polyphenylene polymer.

15. An acoustic galvanic isolator, comprising:
a semiconductor substrate having an insulating layer formed on a top surface thereof;
a carrier signal source disposed on the substrate;
a modulator disposed on the substrate and connected to receive an information signal and the carrier signal and to modulate the information signal onto the carrier signal to produce a modulated signal;
a demodulator disposed on the substrate; and
an electrically-isolating acoustic coupler disposed on the substrate and connected between the modulator and the demodulator, the electrically-isolating acoustic coupler comprising exactly one decoupled stacked bulk acoustic resonator (DSBAR),
wherein the demodulator is adapted to receive the modulated signal from the electrically-isolating acoustic coupler and in response thereto outputs the information signal.

16. The acoustic galvanic isolator of claim 15, wherein the DSBAR comprises a first film bulk acoustic resonator (FBAR), a second FBAR, and an electrically-insulating acoustic decoupler between the FBARs the electrically-insulating acoustic decoupler comprises at least one of: (1) an electrically-insulating acoustic Bragg structure; (2) a quarter-wave thick layer of acoustic coupling material; and (3) at least one layer of crosslinked polyphenylene polymer.

17. The acoustic galvanic isolator of claim 16, wherein the electrically-insulating acoustic decoupler comprises the quarter-wave thick layer of acoustic coupling material.

18. The acoustic galvanic isolator of claim 16, wherein the electrically-insulating acoustic decoupler comprises the at least one layer of crosslinked polyphenylene polymer.

19. The acoustic galvanic isolator of claim 16, wherein the electrically-insulating acoustic decoupler comprises the electrically-insulating acoustic Bragg structure, and wherein the electrically-insulating acoustic Bragg structure comprises first, second, and third Bragg elements, the second Bragg element being disposed in between the first and third Bragg elements and having a lower acoustic impedance than the first and third Bragg elements, respectively, at least one of the Bragg elements comprising a layer of electrically-insulating material.

20. The acoustic galvanic isolator of claim 19, wherein the first Bragg element is a quarter-wave thick layer of a same material as an electrode of the first FBAR, and the third Bragg element is a quarter-wave thick layer of a same material as an electrode of the second FBAR.

* * * * *